United States Patent
Ohmi et al.

(10) Patent No.: US 7,898,033 B2
(45) Date of Patent: Mar. 1, 2011

(54) SEMICONDUCTOR DEVICE

(75) Inventors: Tadahiro Ohmi, Miyagi (JP); Akinobu Teramoto, Miyagi (JP)

(73) Assignees: Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 489 days.

(21) Appl. No.: 11/922,197

(22) PCT Filed: Jun. 16, 2006

(86) PCT No.: PCT/JP2006/312098
§ 371 (c)(1),
(2), (4) Date: Dec. 14, 2007

(87) PCT Pub. No.: WO2006/135039
PCT Pub. Date: Dec. 21, 2006

(65) Prior Publication Data
US 2009/0321832 A1    Dec. 31, 2009

(30) Foreign Application Priority Data

Jun. 17, 2005 (JP) .................. 2005-177613
Dec. 2, 2005 (JP) .................. 2005-349857

(51) Int. Cl.
*H01L 27/12* (2006.01)
(52) U.S. Cl. .......................... 257/350; 257/627
(58) Field of Classification Search .................. 257/350, 257/351, 369, 392, 407, 627
See application file for complete search history.

(56) References Cited

U.S. PATENT DOCUMENTS 3,958,266 A * 5/1976 Athanas .............. 257/262
6,903,393 B2 * 6/2005 Ohmi et al. .......... 257/288

FOREIGN PATENT DOCUMENTS

| JP | 4-367278 | 12/1992 |
| JP | 7-086422 | 3/1995 |
| JP | 2003-115587 A | 4/2003 |
| JP | 2003-209258 A | 7/2003 |

* cited by examiner

*Primary Examiner* — Mark Prenty
(74) *Attorney, Agent, or Firm* — Foley & Lardner LLP

(57) ABSTRACT

A semiconductor device according to this invention is provided with a MOS transistor of at least one type, wherein the MOS transistor has a semiconductor layer (SOI layer) provided on an SOI substrate and a gate electrode provided on the SOI layer and is normally off by setting the thickness of the SOI layer so that the thickness of a depletion layer caused by a work function difference between the gate electrode and the SOI layer becomes greater than that of the SOI layer.

16 Claims, 11 Drawing Sheets

(a)

(b)

(a)

(b)

(a)

(b)

(a)

(b)

(a)

(b)

US 7,898,033 B2

SEMICONDUCTOR DEVICE

This application is the National Phase of PCT/JP2006/312098, filed Jun. 16, 2006, which claims priority to Japanese Application No. 2005-177613, filed Jun. 17, 2005 and Japanese Application No. 2005-349857, filed Dec. 2, 2005, the disclosures of which are hereby incorporated by reference in their entirety.

TECHNICAL FIELD

This invention relates to a semiconductor device such as an IC, LSI, or the like.

BACKGROUND ART

FIG. 5 shows, as a conventional semiconductor device structure, a CMOS inverter circuit being one of electronic circuits for use in a semiconductor device. FIG. 5(a) exemplarily shows a cross section of the CMOS inverter circuit and FIG. 5(b) shows a plan view thereof. For simplification, illustration of wirings 8 to 11 is omitted in FIG. 5(b).

In FIG. 5(a), 1 denotes a p-type semiconductor substrate where an electronic circuit is formed, and 2 denotes an n-type impurity region formed in the p-type semiconductor substrate 1, while 3a and 3b denote high-concentration p-type impurity regions formed in the n-type impurity region 2, and 4a and 4b denote high-concentration n-type impurity regions formed in the p-type semiconductor substrate 1. 5 denotes gate insulating films of $SiO_2$ or the like for insulation between a gate electrode 6 and the p-type semiconductor substrate 1 and between a gate electrode 7 and the n-type impurity region 2, respectively. The gate electrodes 6 and 7 are formed on the gate insulating films 5, 5.

Herein, the n-type impurity region 2, the high-concentration p-type impurity regions 3a and 3b, and the gate electrode 7 form a p-type MOSFET (Metal Oxide Semiconductor Field Effect Transistor) (PMOSFET). On the other hand, the semiconductor substrate 1, the high-concentration n-type impurity regions 4a and 4b, and the gate electrode 6 form an n-type MOSFET. 8 denotes a gate wiring connected to the gate electrodes 6 and 7 of the n-type MOSFET and the p-type MOSFET for applying a common voltage as an input signal of the CMOS inverter circuit. 9 denotes an output wiring connected to the drain electrode (high-concentration p-type impurity region 3a) of the p-type MOSFET and the drain electrode (high-concentration n-type impurity region 4b) of the n-type MOSFET for extracting an output signal of the CMOS inverter. 10 and 11 denote power supply wirings for supplying a power supply potential to the source electrode (high-concentration n-type impurity region 4a) of the n-type MOSFET and the source electrode (high-concentration p-type impurity region 3b) of the p-type MOSFET, respectively.

The operation of this CMOS inverter circuit will be described. In the CMOS inverter circuit comprising the p-type MOSFET and the n-type MOSFET of FIG. 5(a), the power supply wiring 10 connected to the source electrode of the n-type MOSFET is grounded (0V) and the power supply voltage (e.g. 5V) is applied to the power supply wiring 11 connected to the source electrode of the p-type MOSFET. When 0V is applied to the gate wiring 8 as an input signal, the n-type MOSFET is turned off and the p-type MOSFET is turned on. Therefore, the power supply voltage (5V) equal to the power supply wiring 11 is output to the output wiring 9. On the other hand, when 5V is applied to the gate wiring 8, conversely to the above case, the n-type MOSFET is turned on and the p-type MOSFET is turned off, so that the ground voltage (0V) equal to the power supply wiring 10 is output to the output wiring.

In this CMOS type circuit, when the output does not change, the current hardly flows in the transistors, while, it mainly flows when the output changes. That is, when the gate wiring 8 becomes 0V, an output current for charging the output wiring 9 flows through the p-type MOSFET, while, when the gate wiring 8 becomes 5V, an output current for discharging the charge of the output wiring 9 flows through the n-type MOSFET. In this manner, the CMOS circuit of FIG. 5(a) is formed as an inverter circuit adapted to output a signal with a polarity reverse to that of the input. In this inverter circuit, it is necessary to cause the same current to flow in the p-type MOSFET and the n-type MOSFET for equalizing the rising speed and the falling speed upon switching.

However, for example, on the (100) plane, the mobility of holes serving as carriers in the p-type MOSFET is lower than that of electrons serving as carriers in the n-type MOSFET and the ratio is 1:3. Therefore, if the p-type MOSFET and the n-type MOSFET are the same in area, there occurs a difference in current driving capability therebetween and thus the operating speeds cannot be the same. Accordingly, as shown in FIG. 5(b), the areas of the drain electrode 3a, the source electrode 3b, and the gate electrode 7 of the p-type MOSFET are set larger than those of the drain electrode 4b, the source electrode 4a, and the gate electrode 6 of the n-type MOSFET corresponding to their mobility ratio to substantially equalize the current driving capabilities, thereby making the switching speeds equal to each other. However, the area occupied by the p-type MOSFET becomes three times that of the n-type MOSFET and thus the areas occupied by the p-type MOSFET and the n-type MOSFET become unbalanced, which has been a barrier to improvement in integration degree of semiconductor devices.

As a prior document relating to improvement in current driving capability of a p-type MOSFET, there is Patent Document 1 mentioned below. In Patent Document 1, the current driving capability of a p-type MOSFET is improved by using the (110) plane. Further, Patent Document 2 describes that the current driving capability of a p-type MOSFET is improved by using an SOI substrate and forming an accumulation-mode p-type MOSFET on the SOI substrate. However, when an arbitrary substrate is used, it is impossible to equalize the current driving capabilities of the n-type MOSFET and the p-type MOSFET having the same size in a normally-on state.
Patent Document 1: Japanese Unexamined Patent Application Publication (JP-A) No. 2003-115587
Patent Document 2: Japanese Unexamined Patent Application Publication (JP-A) No. H07-086422

DISCLOSURE OF THE INVENTION

Problem to be Solved by the Invention

As described above, in the CMOS circuit using the (100) crystal plane, the current driving capabilities of the n-type MOSFET and the p-type MOSFET having the same area differ from each other and thus there is a difference in switching speed. In order to make the switching speeds (rising and falling) equal to each other, it is necessary to increase a channel width of the p-type MOSFET. Therefore, the areas occupied by the n-type MOSFET and the p-type MOSFET become unbalanced, which has been a barrier to improvement in integration degree of semiconductor devices. Although the current driving capability of the p-type MOSFET is improved in the foregoing Patent Documents 1 and 2, it is insufficient in making the sizes of the n-type MOSFET and the p-type MOSFET equal to each other.

This invention has been made in order to solve the foregoing problem and has an object to obtain a semiconductor device that can equalize the switching speeds without increasing the areas of electrodes of one of transistors forming an internal circuit, thereby making it possible to increase the integration degree.

Means for Solving the Problem

This invention has the following aspects.
(First Aspect)
In a semiconductor device comprising a circuit having transistors of different conductivity types, the semiconductor device is characterized by comprising at least one kind of transistor. The transistor comprises an SOI layer provided on an SOI substrate and a gate electrode formed by a high-concentration layer of the same conductivity type as the SOI layer and provided on the SOI layer. A thickness of the SOI layer is set so that a thickness of a depletion layer caused by a work function difference between the gate electrode and the SOI layer becomes greater than that of the SOI layer, and a surface of a region for forming a channel has a plane within ±10° from a (110) plane.
(Second Aspect)
In a semiconductor device comprising a circuit having transistors of different conductivity types, the semiconductor device is characterized by comprising an MOS-type transistor provided on an SOI substrate, and an MOS transistor having, on a first face of the SOI substrate, a gate electrode of the same conductivity type as the MOS-type transistor and source/drain layers of a conductivity type different from the MOS-type transistor. A surface of a region for forming a channel has a plane within ±10° from a (110) plane.

That is, the semiconductor device according to the first and second aspects comprise an MOS-type transistor provided on an SOI (Silicon on Insulator) substrate and an accumulation-mode MOS transistor having, on a first face of the semiconductor substrate provided with the MOS-type transistor, source/drain electrodes of a conductivity type different from the MOS-type transistor and a gate electrode of the same conductivity type as the MOS-type transistor, wherein a surface having a channel mobility of silicon (100) or equivalent thereto is used for a channel, the accumulation-mode MOS transistor being off when a gate voltage is zero.
(Third Aspect)
In the first and second aspects, a thickness of an SOI layer on the SOI substrate is controlled so as to make areas, in a plane, of the transistors of different conductivity types and current driving capabilities thereof substantially equal to each other. That is, the semiconductor device according to the third aspect comprises a PMOS transistor and an NMOS transistor whose current driving capabilities are substantially the same by controlling the thickness of an SOI layer.
(Fourth Aspect)
In the third aspect, a gate insulating film is formed between the gate electrode and the SOI layer and contains at least one kind of $SiO_2$, $Si_3N_4$, an oxide film of a metal silicon alloy, and a nitride film of a metal silicon alloy formed by a microwave-excited plasma.
(Fifth Aspect)
In the fourth aspect, the gate insulating film is formed at a temperature of 600° C. or less. That is, in the semiconductor device according to the fifth aspect, the gate insulating film of the MOS transistor is formed by the microwave-excited plasma at a temperature of 600° C. or less.
(Sixth Aspect)
In a semiconductor device comprising a circuit having at least one pair of transistors of different conductivity types, the semiconductor device is characterized in that at least one of the transistors comprises at least a semiconductor layer provided on an SOI substrate, a gate insulating layer covering at least a portion of a surface of the semiconductor layer, and a gate electrode formed on the gate insulating layer and is formed as a normally-off accumulation mode. A material of the gate electrode and an impurity concentration in the semiconductor layer are selected so that a thickness of a depletion layer formed in the semiconductor layer by a work function difference between the gate electrode and the semiconductor layer becomes greater than that of the semiconductor layer.
(Seventh Aspect)
In the sixth aspect, the normally-off accumulation-mode transistor has a channel region formed on a plane within ±10° from a (110) plane.
(Eighth Aspect)
In the sixth aspect, the normally-off accumulation-mode transistor has a channel region formed on a plane different from a plane within ±10° from a (110) plane.

EFFECT OF THE INVENTION

According to this invention, it comprises an MOS transistor provided on an SOI (Silicon on Insulator) substrate and an MOS transistor having, on a first face of the SOI substrate provided with the MOS transistor, source/drain electrodes of a conductivity type different from the MOS transistor and a gate electrode of the same conductivity type as the MOS transistor, wherein a surface having a channel mobility of silicon (100) or equivalent thereto is used for a channel.

With this configuration, there are obtained a PMOS transistor and an NMOS transistor having the same current driving capability. Since it is possible to equalize the areas of a PMOS transistor and an NMOS transistor of an electronic circuit, there is obtained a semiconductor device having the same switching speed and capable of increasing the integration degree.

BRIEF DESCRIPTION OF THE DRAWINGS

FIGS. 12 12(a) and (b) are diagrams respectively showing the drain voltage-drain current characteristics of an accumulation-mode transistor according to a coventional device and according to this invention.

BEST MODE FOR CARRYING OUT THE INVENTION

Hereinbelow, semiconductor devices of this invention will be described with reference to the drawings.

First Embodiment

Figure 1:
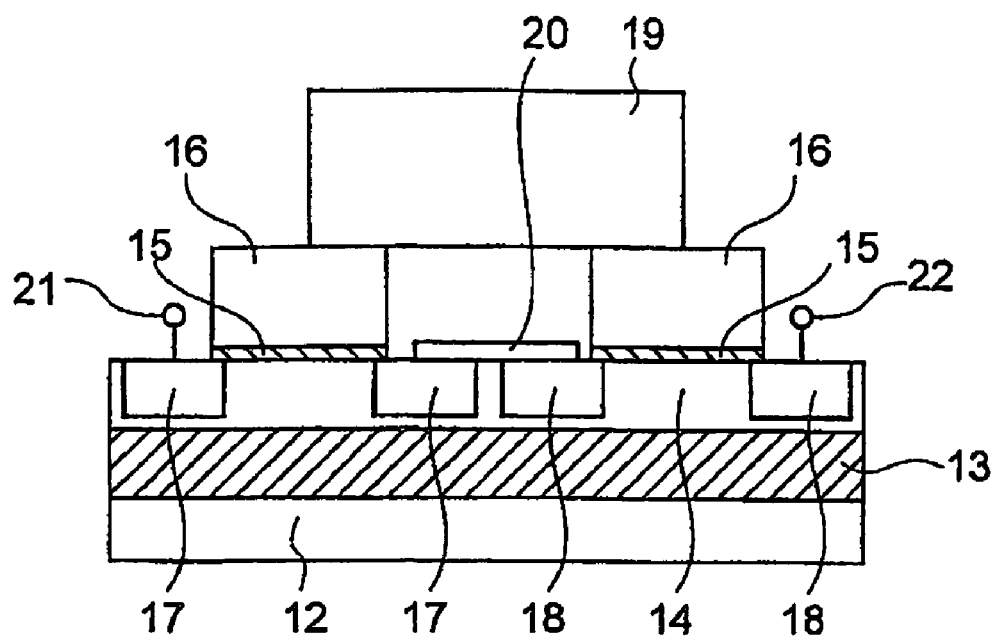
FIG. 1 is a cross sectional view of a semiconductor device according to a first embodiment of this invention.

The first embodiment will be described using FIGS. 1 to 4. FIG. 1 shows a cross sectional view of a semiconductor device of this invention, FIG. 2 shows a cross sectional view of an SOI substrate, FIG. 3 shows a correlation diagram of the depletion layer thickness and the substrate impurity concentration, and FIG. 4 shows current-voltage characteristic diagrams representing an effect of this invention.

Figure 2:
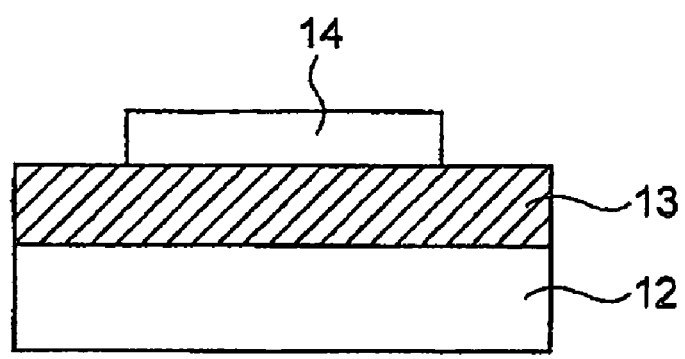
FIG. 2 is a cross sectional view of an SOI substrate in the first embodiment of this invention.

As shown in FIG. 2, there is prepared a substrate having a 45 nm, (110) plane orientation, n-type (substrate phosphorus concentration $10^{17}$ cm$^{-3}$) SOI (Silicon on Insulator) layer 14, separated by a 200 nm-thickness buried oxide film 13, on a support substrate 12. The SOI layer 14 is etched at its portions other than those portions where transistors will be formed, thereby separating the respective regions. In this event, threshold adjusting impurity implantation may be performed in the respective regions to carry out substrate concentration adjustment. After cleaning, gate oxidation is performed using a microwave-excited plasma apparatus, thereby forming a 7 nm SiO$_2$ (gate insulating film) 15. The gate insulating film 15 is preferably formed at a temperature of 600° C. or less, wherein the thickness may be set to a value for obtaining a desired capacitance. As the gate insulating film, use may be made of a high permittivity material, such as Si$_3$N$_4$, a metal oxide such as HfOx, ZrOx, or La$_2$O$_3$, or a metal nitride such as Pr$_x$Si$_y$N$_z$.

Thereafter, polycrystal silicon containing $10^{20}$ cm$^{-3}$ or more boron is formed and then etched to a desired gate length and width, thereby forming gate electrodes 16. In this event, since a work function of P+-polycrystal silicon being the gate electrode 16 is approximately 5.15 eV and a work function of the $10^{17}$ cm$^{-3}$ n-type silicon layer of the substrate is approximately 4.25 eV, a work function difference of approximately 0.9 eV occurs. In this event, since the thickness of a depletion layer is about 90 nm, the 45 nm-thickness SOI layer is fully depleted. Therefore, an accumulation-mode NMOS (n-type MOS) transistor according to this invention is normally off.

Figure 3:
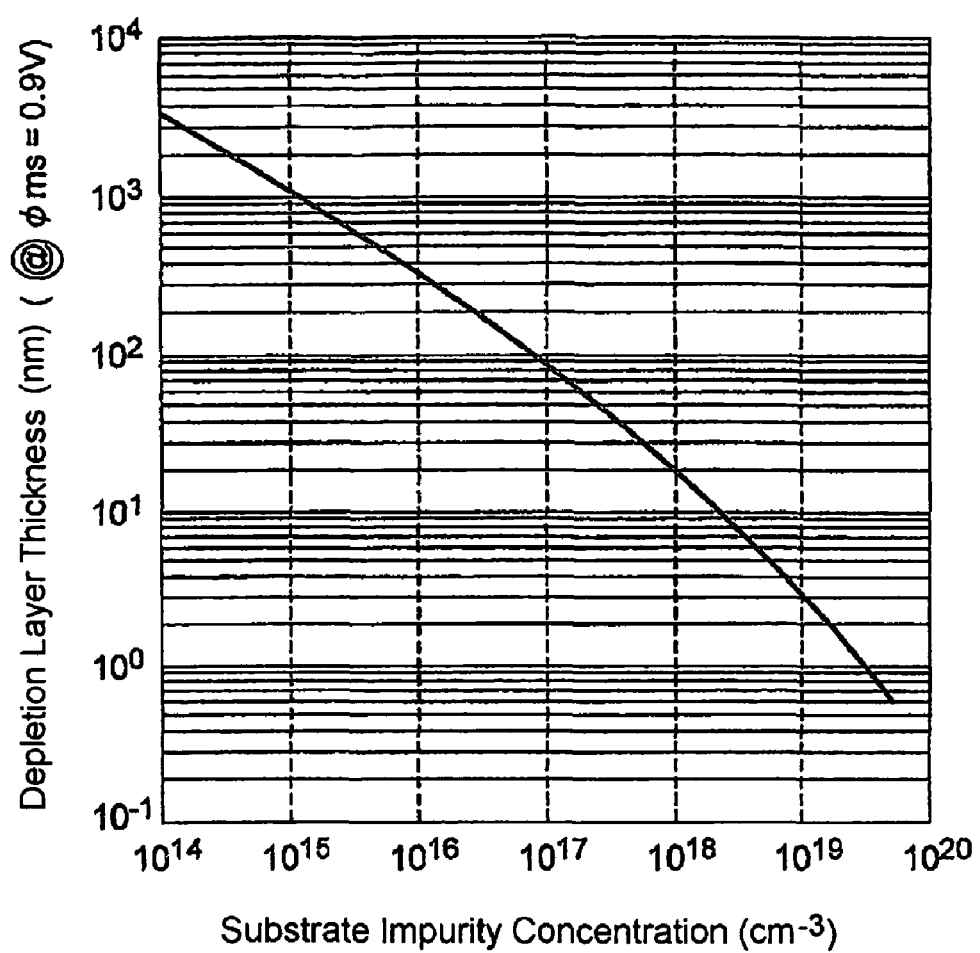
FIG. 3 is a correlation diagram of depletion layer thickness and substrate impurity concentration in the embodiment of this invention.
Figure 4:
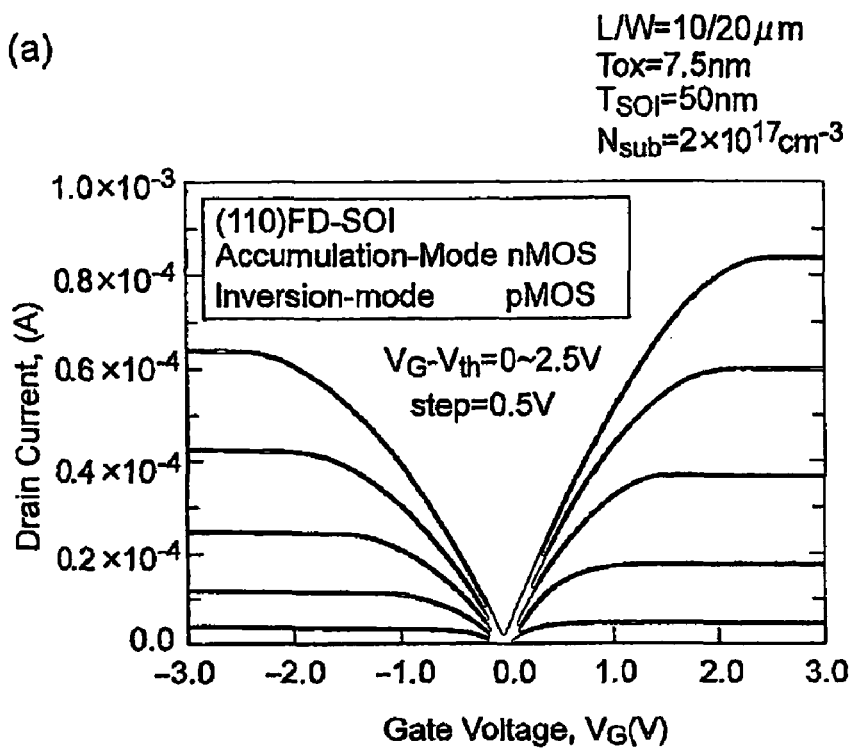
FIG. 4 shows current-voltage characteristics representing an effect of this invention, wherein (a) is a drain voltage-drain current characteristic diagram and (b) is a gate voltage-drain current characteristic diagram.
Figure 4:
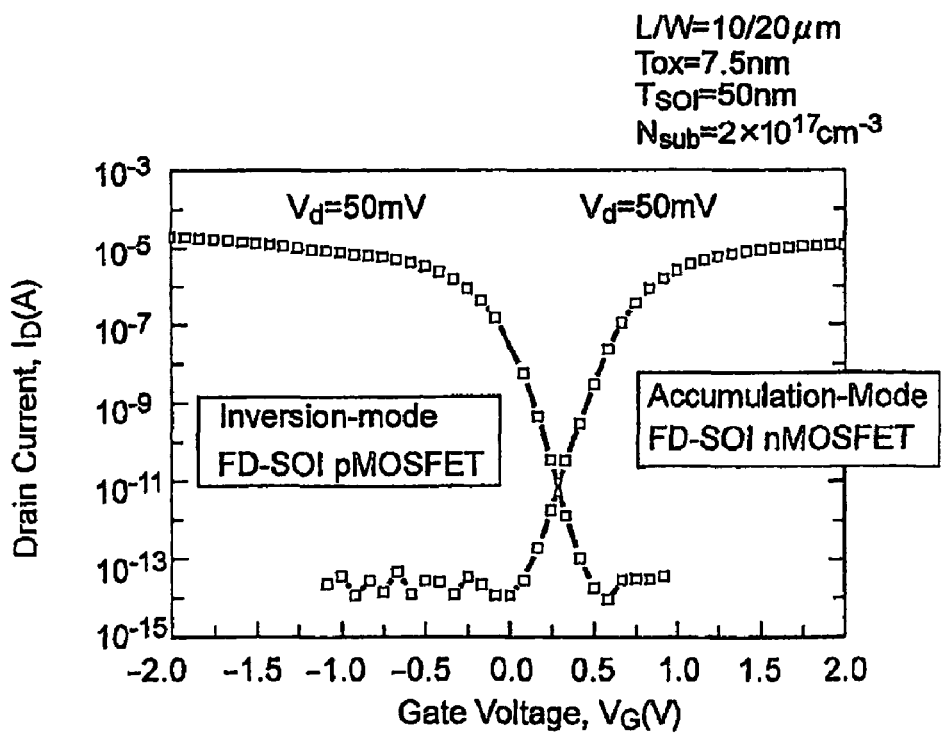
Figure 5:
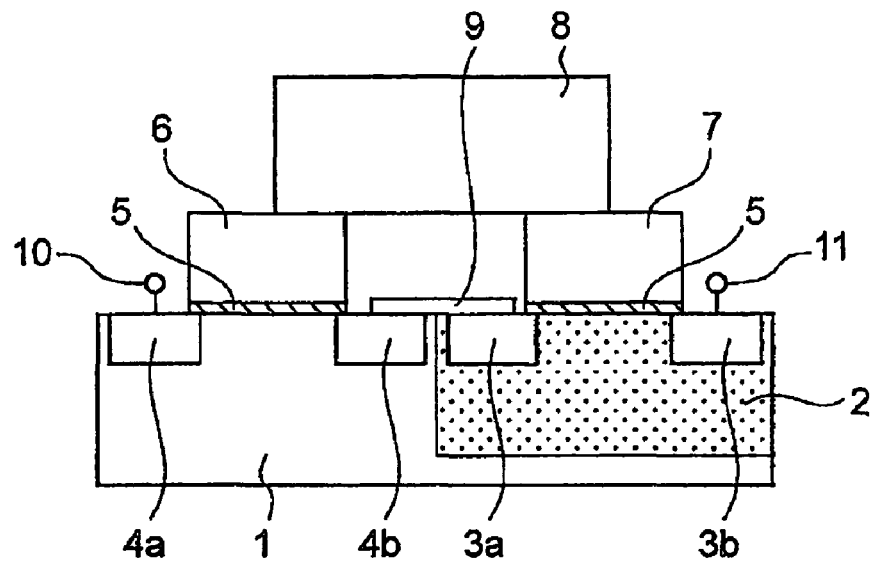
FIG. 5 is (a) a cross sectional view and (b) a plan view of a conventional semiconductor device.
Figure 5:
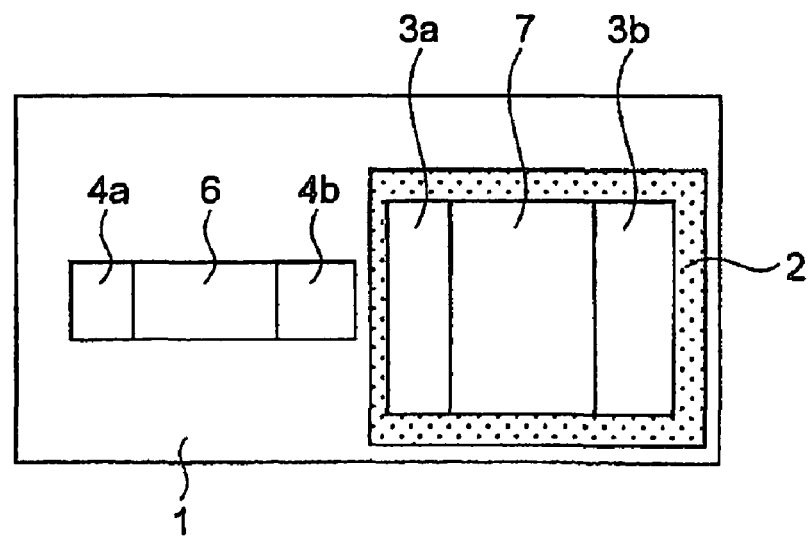

FIG. 3 shows the relationship between the substrate impurity concentration and the depletion layer thickness when the work function difference is 0.9V. Herein, the substrate impurity concentration and the SOI film thickness can be selected in a range where the SOI film thickness is smaller than the depletion layer thickness.

Thereafter, $4 \times 10^{15}$ cm$^{-2}$ of arsenic is ion-implanted into source/drain layers 17 of the NMOS transistor region and $4 \times 10^{15}$ cm$^{-2}$ of boron is ion-implanted into source/drain layers 18 of the PMOS (p-type MOS) transistor region, thereby performing activation. Further, by forming an SiO$_2$ film by CVD and forming a gate wiring 19, an output wiring 20, a power supply wiring 21, and a power supply wiring 22 as wiring layers, a PMOS transistor and an accumulation-mode NMOS transistor according to this invention can be formed on the same substrate as shown in FIG. 1. FIG. 4 shows the transistor characteristics thereof.

As shown in FIG. 4, if the SOI layer has a plane orientation, such as a (551) plane, that is inclined within ±10° from the (110) plane, the NMOS transistor and the PMOS transistor have substantially the same current driving capability. As a result, the areas of the NMOS transistor and the PMOS transistor can be balanced and made substantially equal to each other. As a gate electrode material, use may be made, instead of the polycrystal silicon, of W, Pt, Ni, Ge, Ru, or its silicide if the SOI layer is fully depleted in consideration of a work function difference.

In the CMOS structure of this invention, the SOI layer has a plane orientation inclined within ±10° from the (110) plane and the thickness of the SOI layer is set smaller than that of a depletion layer caused by a work function difference between the gate electrode and the SOI layer. With this configuration, the current driving capability is improved so that the NMOS transistor and the PMOS transistor are balanced to have substantially the same current driving capability. Further, by forming the NMOS transistor and the PMOS transistor on the same semiconductor substrate, there is also an advantage in that the area corresponding to insulation isolation can be reduced. By balancing the NMOS transistor and the PMOS transistor so as to have substantially the same current driving capability in this manner, there is obtained a semiconductor device that can increase the integration degree.

Second Embodiment

Figure 6:
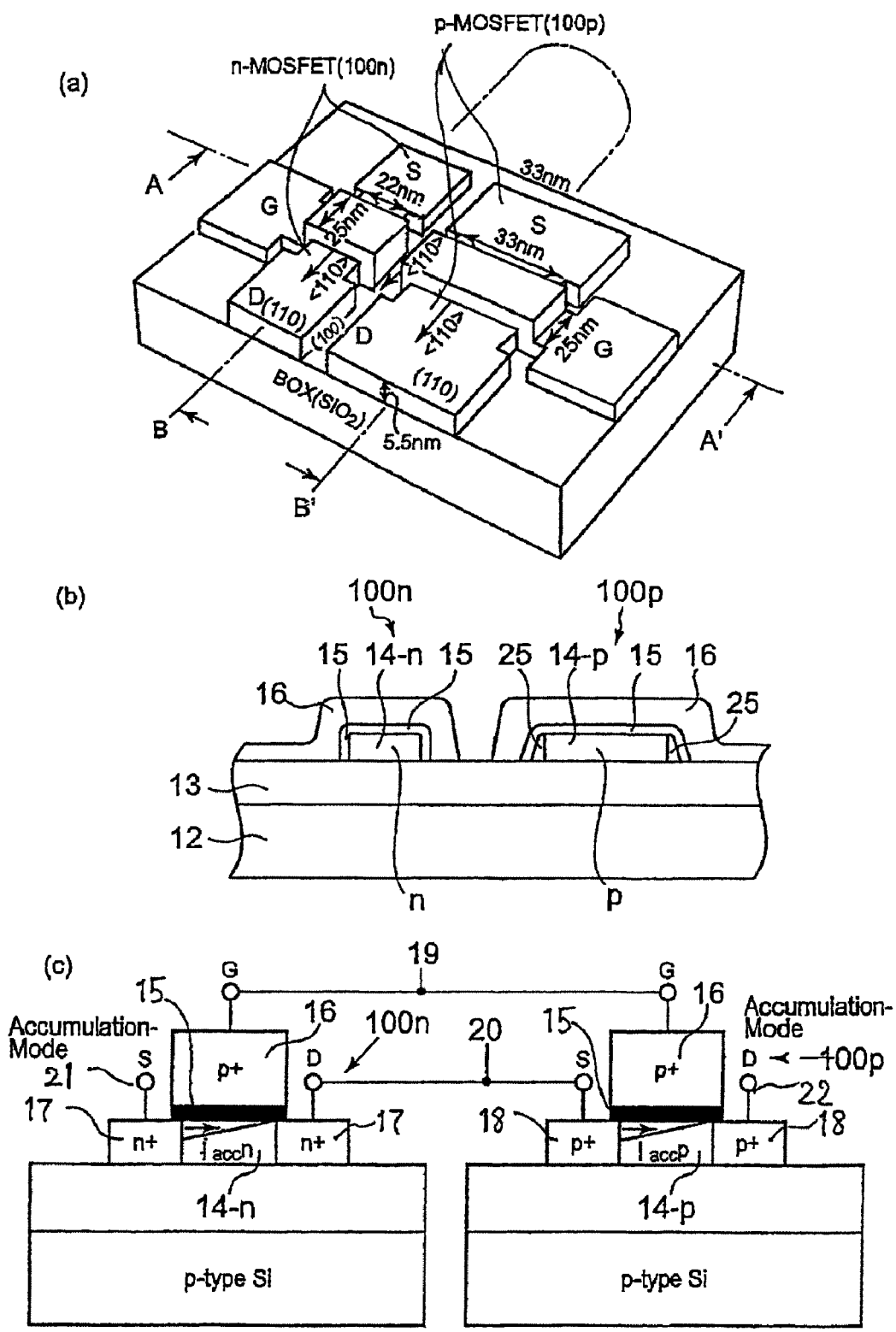
FIG. 6 is diagrams showing a semiconductor device according to a second embodiment of this invention, wherein (a) is a perspective view, and (b) and (c) are cross sectional views taken along line A-A' and line B-B' in FIG. 6(a), respectively.

The second embodiment will be described using FIG. 6. FIG. 6(a) shows a schematic perspective view of a semiconductor device according to the second embodiment of this invention, FIG. 6(b) shows a cross sectional view taken along line A-A' in FIG. 6(a), and FIG. 6(c) shows a cross sectional view taken along line B-B' in FIG. 6(a). The embodiment of FIG. 6 is an SOI-type three-dimensional structure CMOS device. In this CMOS device, a PMOS transistor is fabricated only on the (110) plane where the hole mobility is large, while, an NMOS transistor is fabricated on the (110) plane where the electron mobility is slightly inferior, with its gate formed also on the (100) plane of the side walls where the electron mobility is large. That is, the NMOS transistor has a three-dimensional structure and the PMOS transistor has a planar structure, both of which are of the accumulation mode according to this invention.

As shown in FIGS. 6(b) and (c), there is prepared a substrate having predetermined-thickness, (110) plane orientation silicon, i.e. n-type (substrate phosphorus concentration $10^{17}$ cm$^{-3}$) SOI (Silicon on Insulator), layers 14-n and 14-p, separated by a 200 nm-thickness buried oxide film 13, on a support substrate 12. Herein, the surface of each of the SOI layers 14-n and 14-p is preferably such that the channel length direction is a <110> direction. This is because the saturation current amount by the movement of holes on the (110) plane becomes maximum in the <110> direction. On the other hand, it is necessary to take into consideration that the crystal-direction dependence of the saturation current amount by the movement of electrons on the (100) plane is small.

In the illustrated example, the SOI layer is removed by etching at its portions other than the region 14-$n$ where the NMOS transistor will be formed and the region 14-$p$ where the PMOS transistor will be formed. As a result, the regions 14-$n$ and 14-$p$ are separately formed on the oxide film 13. The SOI layer may be common to both regions as an i layer or may be formed as an n-type and, later, the region 14-$p$ where the PMOS transistor will be formed may be converted to a p-type. In this event, threshold adjusting impurity implantation may be performed to carry out substrate concentration adjustment. For example, in the 100 nm generation, the substrate concentration is set to $4 \times 10^{18}$ cm$^{-3}$. The side surfaces of the separated regions are the (100) plane. Among these side surfaces, on the side surfaces excluding the side surfaces of a channel region of the transistor region 14-$n$, a thick oxide film 25 is formed by a known method as shown in FIG. 6($b$).

For example, the thick oxide film 25 can be formed by the following method. At first, after depositing SiO$_2$ to 45 nm or more by CVD, etching is performed using small-damage anisotropic etching while leaving the oxide film on the side walls. Then, masking other than the transistor region 14-$n$, the thick oxide film on the side surfaces, the side walls, of the channel region of the transistor region 14-$n$ is removed by wet etching, thereby leaving the thick oxide film 25 on the side walls of the transistor region 14-$p$.

In FIG. 6($b$), after the formation of the oxide film 25, cleaning is performed and, subsequently, gate oxidation is performed using a microwave-excited plasma apparatus, thereby forming a 7 nm SiO$_2$ film (gate insulating film) 15 on the upper surface and the side surfaces of the channel region of the transistor region 14-$n$ and on the upper surface of the channel region of the transistor region 14-$p$. In this event, the thickness may be set to a value for obtaining a desired capacitance. As the gate insulating film 15, use may be made of a high permittivity material, such as Si$_3$N$_4$, a metal oxide such as HfOx, ZrOx, or La$_2$O$_3$, or a metal nitride such as Pr$_x$Si$_y$N$_z$.

Thereafter, a polycrystal silicon layer containing $10^{20}$ cm$^{-3}$ or more phosphorus or boron or phosphorous and arsenic in total concentration is formed and then etched to a desired gate length and width, thereby forming gate electrodes 16. Thereafter, $4 \times 10^{15}$ cm$^{-2}$ of arsenic is ion-implanted into source/drain layers 17 of the NMOS transistor region and $4 \times 10^{15}$ cm$^{-2}$ of boron is ion-implanted into source/drain layers 18 of the PMOS transistor region, thereby performing activation.

Further, an SiO$_2$ film is formed by CVD and, as shown in FIG. 6($c$), a gate wiring 19, an output wiring 20, a power supply wiring 21, and a power supply wiring 22 are formed as wiring layers. Thus, an accumulation-mode PMOS transistor 100$p$ and an accumulation-mode NMOS transistor 100$n$ can be formed on the same substrate. Herein, the total area of the upper surface and the side surfaces of the channel region of the transistor region 14-$n$ and the area of the upper surface of the channel region of the transistor region 14-$p$ are set equal to each other and, further, the operating speeds of both transistors are set equal to each other.

Herein, the lengths L of the channel regions of both transistors 100$p$ and 100$n$ are set equal to each other, the width of the upper surface of the channel region of the transistor region 14-$n$ is given by Wn, the height of the side surface thereof is given by H, and the width of the upper surface of the channel region of the transistor region 14-$p$ is given by Wp. Then, a later-described formula (1) should be established.

A later-described formula (2) should be established in order for the operating speeds of both transistors to be equal to each other. Herein, given that mutual conductances on the (100) and (110) planes of the accumulation-mode NMOS transistor are gmn(100) and gmn(110), respectively, and a mutual conductance on the (110) plane of the accumulation-mode PMOS transistor is gmp(110), the mutual conductances gmn(100), gmn(110), and gmp(110) are all known. Further, if, for example, the width Wn is set to a proper value, the required height H and width Wp are obtained as solutions of simultaneous equations of the formula (1) and the formula (2). If the SOI layer has a plane orientation, such as a (551) plane, that is inclined within ±10° from the (110) plane, the NMOS transistor and the PMOS transistor have substantially the same current driving capability.

Under such conditions, if, for example, the width Wn is set to 22 nm, the mutual conductance gmn(110) is set to about 0.7 gmn(100), and the mutual conductance gmp(110) is set to 0.8 gmn(100), the height H is 5.5 nm and the width Wp is 33 nm. In the illustrated example, the channel lengths of both transistors are set to 25 nm.

$$Wp = 2H + Wn \quad (1)$$

$$gmp(110) \times Wp = gmn(100) \times 2H + gmp(110) \times Wn \quad (2)$$

With this configuration, the channel areas and the gate areas of the NMOS transistor 100$n$ and the PMOS transistor 100$p$ can be made substantially equal to each other and, therefore, the current driving capabilities of both transistors and thus the operating speeds thereof can be made substantially equal to each other, so that a full-balanced CMOS can be obtained. With this configuration, it is possible to reduce the required area to half or less and to increase the speed by about one digit as compared with the conventional example. Further, by equalizing the gate areas of both p- and n-transistors, the gate capacitances of both transistors become equal to each other, so that the offset noise of an analog switch formed by these transistors can be reduced by as much as 15 dB.

Figure 7:
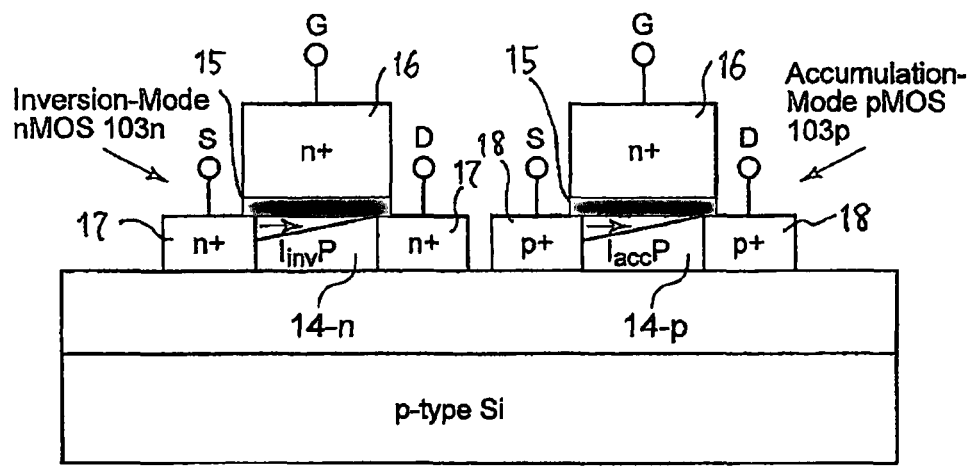
FIGS. 7(a) and (b) are cross sectional views of semiconductor devices according to other two embodiments of this invention.
Figure 7:
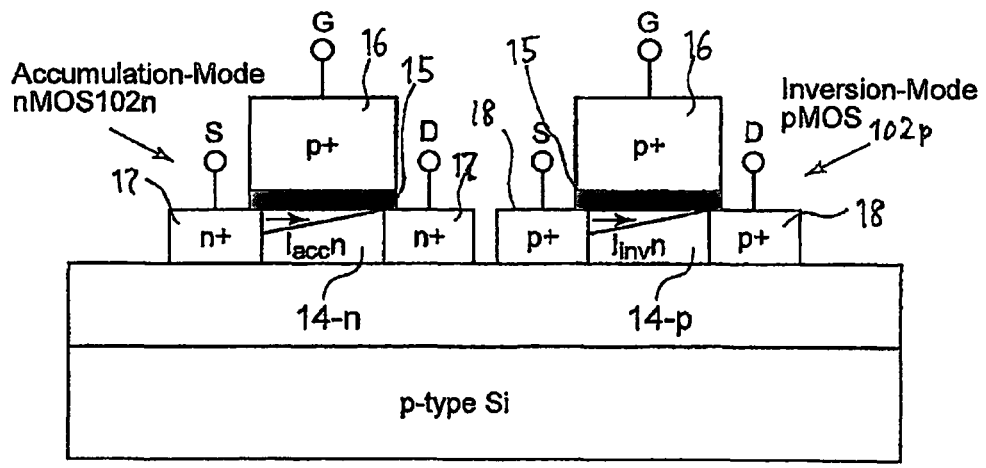
Figure 8:
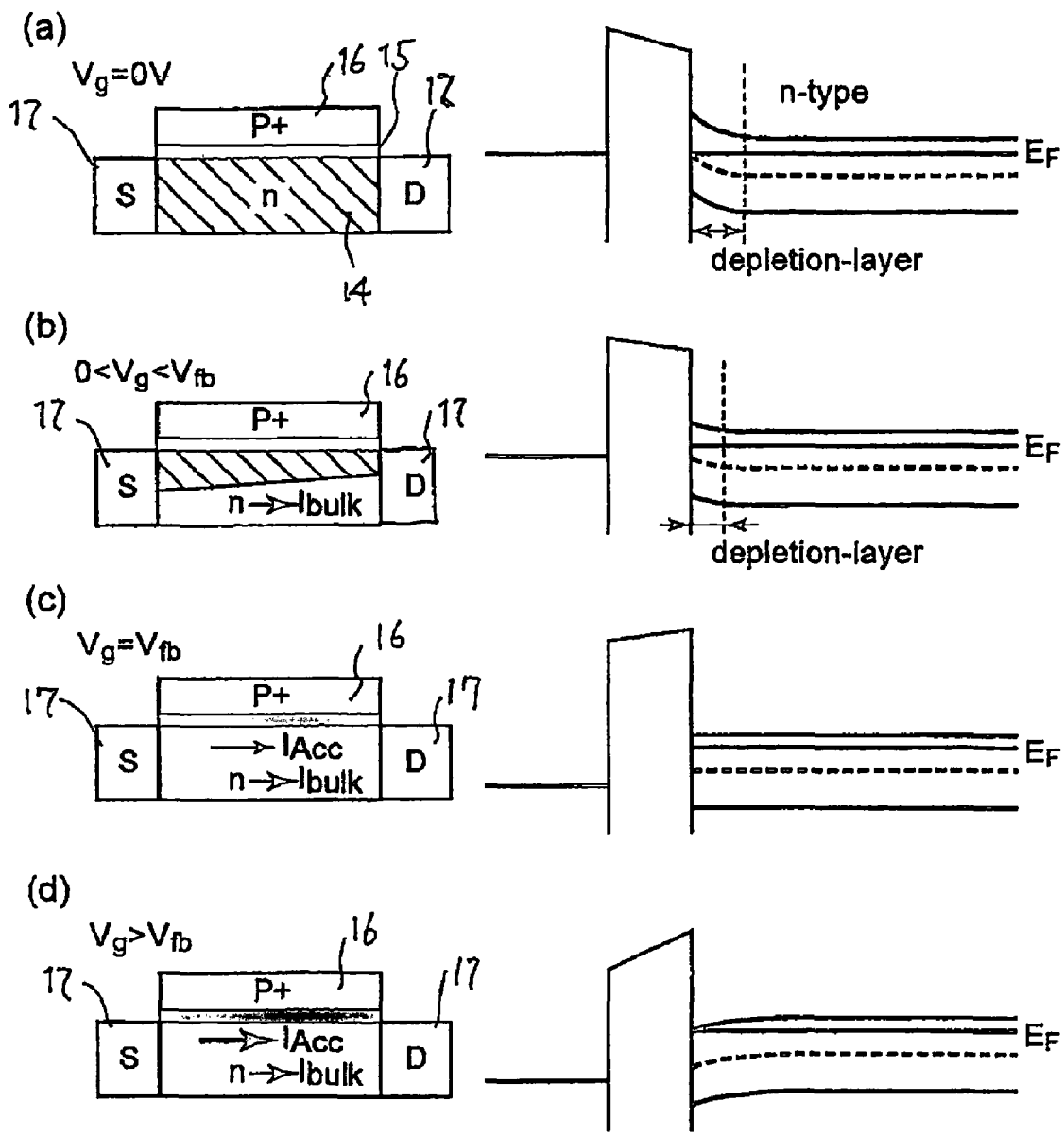
FIGS. 8(a), (b), (c), and (d) are diagrams showing the operating principle of an accumulation-mode transistor according to this invention.
Figure 9:
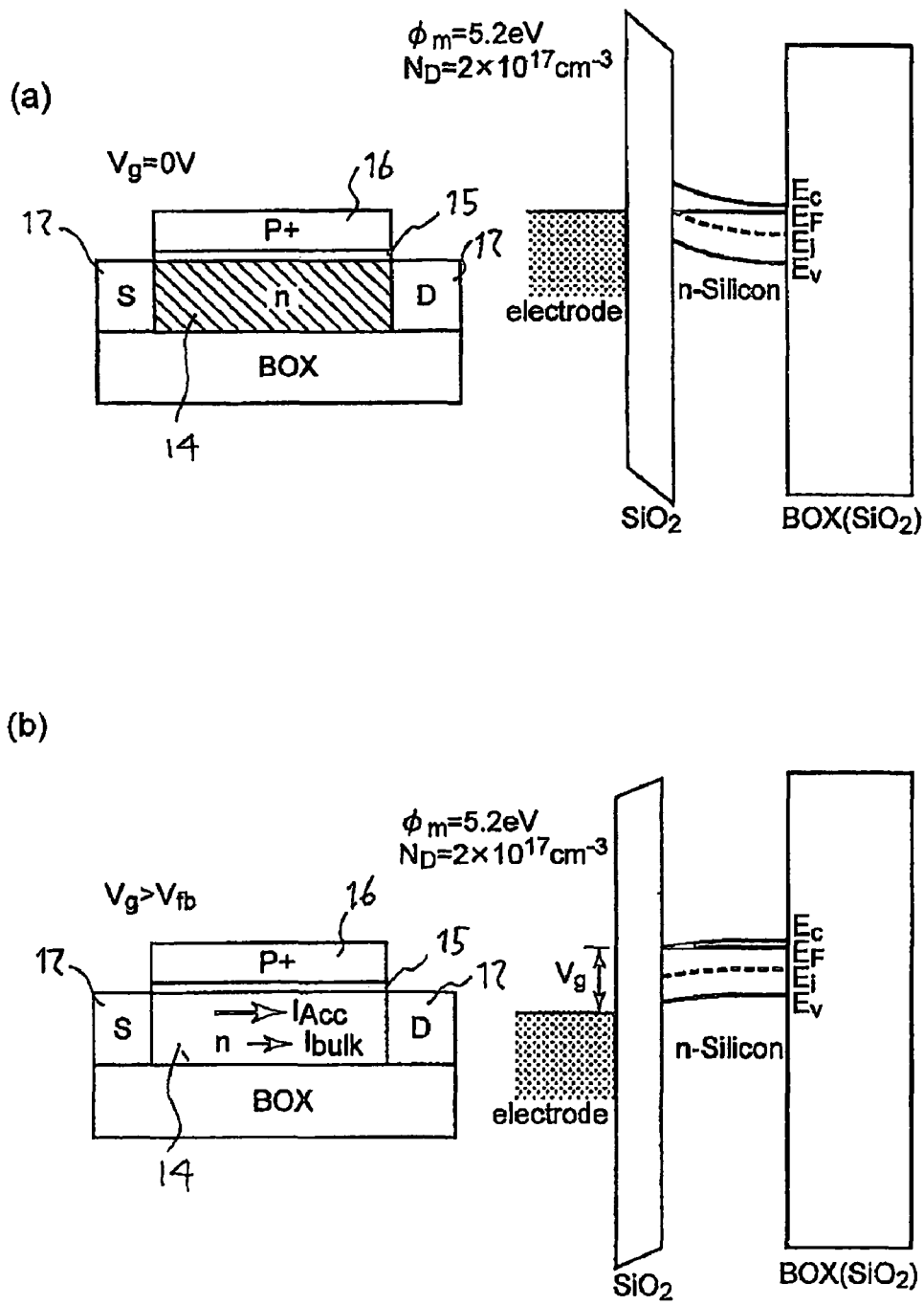
FIGS. 9(a) and (b) are cross sectional views showing the structure of an accumulation-mode transistor according to this invention and diagrams showing the band structure thereof.

FIGS. 7($a$) and ($b$) show other two embodiments in the form of modifications of FIG. 6($c$) and are cross sectional views in the direction corresponding to FIG. 6($c$).

FIG. 7($a$) shows an example in which an NMOS transistor 103$n$ is of the inversion mode and a PMOS transistor 103$p$ is of the accumulation mode. Since the structure of this example is formed by wells (p-wells) of the same conductivity type and gate electrodes of the same conductivity type (n$^+$-type), there is an advantage in that the process is simplified. Further, since only the n$^+$-type polysilicon gate electrodes are used, it is possible to prevent diffusion of boron caused by film thickness reduction (boron tends to diffuse into a gate oxide film and thus there occurs a phenomenon that the interface mobility of carriers is degraded).

Figure 12:
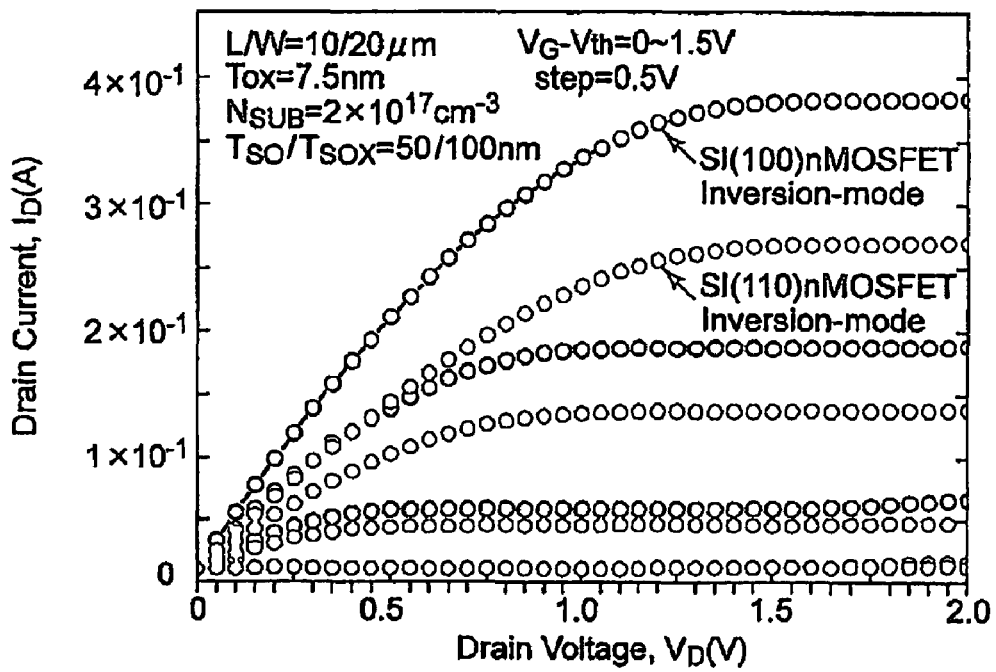
Figure 12:
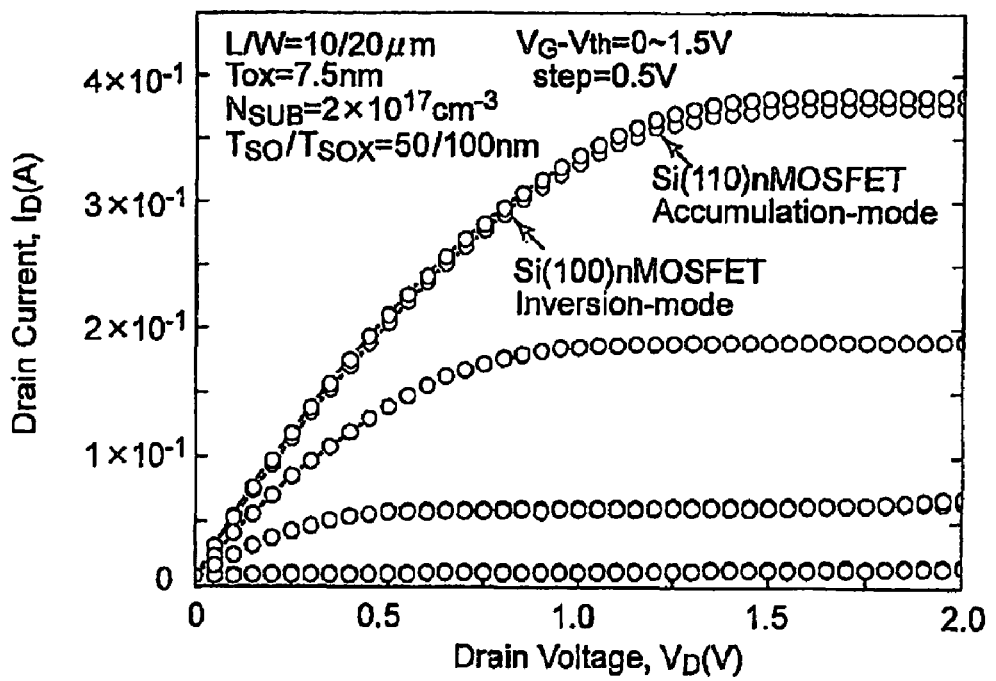

FIG. 7($b$) shows an example in which an NMOS transistor 102$n$ is of the accumulation mode and a PMOS transistor 102$p$ is of the inversion mode. Since the structure of FIG. 7($b$) is formed by wells (n-wells) of the same conductivity type and gate electrodes of the same conductivity type (p$^+$-type), there is an advantage in that the process is simplified. Further, using the accumulation-mode NMOS transistor, the 1/f noise of the entire CMOS can be reduced. As will be described hereinbelow, according to this invention, there is also an advantage in that, using the accumulation-mode transistor, the current driving capability increases as compared with the inversion-mode transistor (FIG. 12).

Herein, referring to FIGS. 8 to 12, the accumulation-mode transistor according to this invention will be described using the NMOS transistors 100n and 102n of FIGS. 6(c) and 7(b) as examples.

FIG. 8(a) to (d) show the operating principle of the accumulation-mode NMOS transistor. At first, as shown in FIG. 8(a), when a gate voltage Vg is zero, a depletion layer extends over the entire SOI layer 14. As shown in FIG. 8(b), when the gate voltage Vg is applied, the depletion layer retreats to the upper surface of the channel and a bulk current $I_{bulk}$ flows. Subsequently, when the gate voltage increases, an accumulated current $I_{acc}$ also flows as shown in FIGS. 8(c) and (d).

This phenomenon will be explained using FIGS. 9(a) and (b). By employing the SOI structure and setting the width of a depletion layer formed by a work function difference between the gate electrode 16 and the SOI layer 14 to be greater than the thickness of the SOI layer 14, it is possible to obtain an accumulation-structure normally-off type MOS transistor as shown in FIG. 9(a). Herein, using $p^+$-polysilicon (work function 5.2 eV) as the gate electrode 16 in the NMOS transistor as illustrated and using $n^+$-polysilicon (work function 4.1 eV) as the gate electrode 16 in the PMOS transistor, it is possible to provide a work function difference with respect to the SOI layer 14.

As shown in FIG. 12, by forming an accumulation-structure NMOS transistor on the silicon (110) plane, it is possible to realize the current driving capability equal to that of a normal NMOS transistor formed on the silicon (100) plane. Further, by forming an accumulation-structure PMOS transistor on the silicon (110) plane, it is possible to realize the current driving capability that is 2.5 times that of a normal PMOS transistor formed on the silicon (100) plane.

Figure 10:
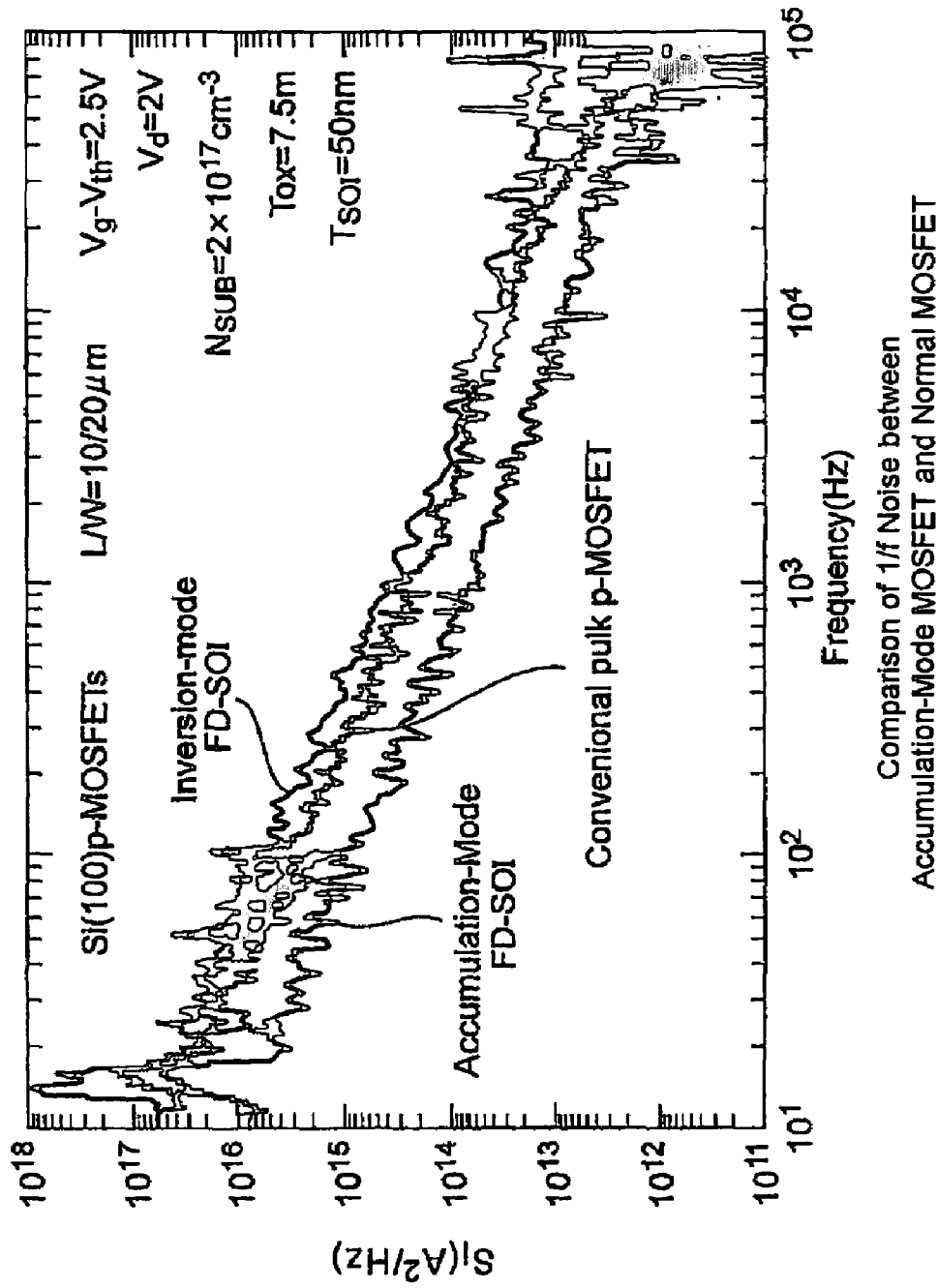
FIG. 10 is a diagram showing 1/f noise of an accumulation-mode transistor according to this invention.
Figure 11:
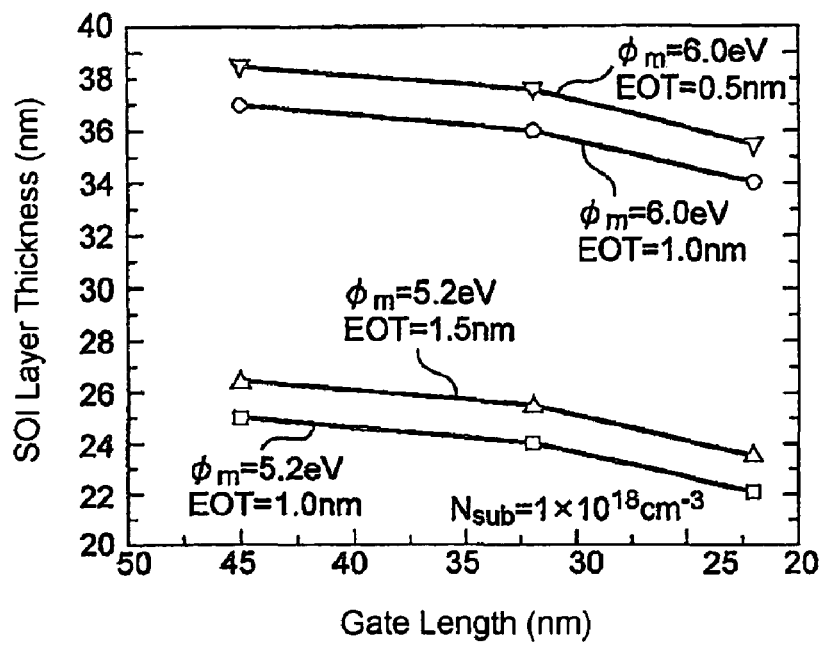
FIGS. 11(a) and (b) are diagrams showing the relationship between the work function of a gate electrode and the thickness of an SOI layer in an accumulation-mode transistor according to this invention.
Figure 11:
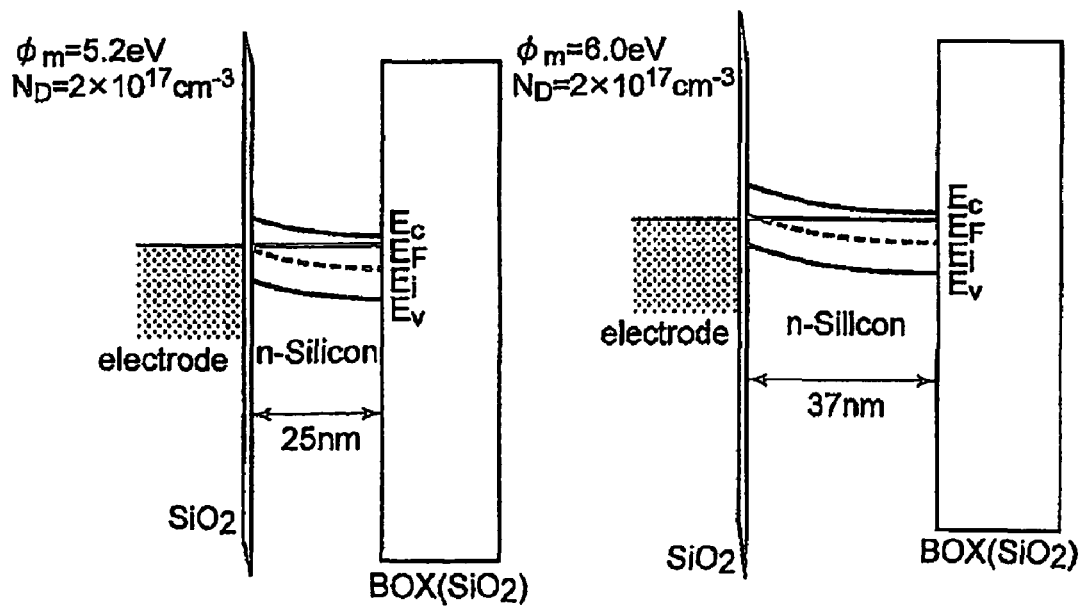

Further, as shown in FIG. 10, the 1/f noise can also be reduced. The accumulation-mode device of this invention does not realize normally-off by a pn junction barrier. The accumulation-mode device of this invention becomes normally off if the work function difference between the gate electrode and the SOI layer, the thickness of the SOI layer, the drain voltage, and the source-drain distance are optimized so that a depletion layer is present to form a barrier between the source and the drain when the gate voltage is 0V as shown in FIG. 9(a).

As shown in FIG. 9(b), since a channel is formed in an accumulation layer when the device is on, a vertical electric field of the channel region becomes smaller as compared with an inversion-mode MOS transistor that forms a normal inversion layer and, thus, it is possible to increase the effective mobility. Therefore, even if the impurity concentration in the SOI layer increases, degradation of the mobility does not occur. Further, since the current flows not only in the accumulation layer but also in the entire SOI layer (bulk portion) when the device is on, it is possible to increase the current driving capability as the impurity concentration in the SOI layer becomes higher.

As compared with a normal MOS transistor in which, following the miniaturization, the channel mobility is degraded as the impurity concentration in a channel region increases, the accumulation-mode device of this invention is very advantageous for the miniaturization. In order to increase the current driving capability as much as possible and realize normally-off while providing punch-through resistance to the miniaturization, it is preferable to use a gate electrode with a work function as large as possible in an accumulation-mode NMOS transistor and a gate electrode with a work function as small as possible in an accumulation-mode PMOS transistor.

In the accumulation-mode device of this invention, a depletion layer is formed in the SOI layer by increasing a work function difference between the gate electrode material and the SOI layer as described above so that an electric field in the channel direction caused by a voltage applied to the drain electrode does not affect an end of the source, thereby achieving the punch-through resistance. The current driving capability increases as the thickness of the SOI layer becomes greater, but an electric field from the gate generated by the work function difference hardly exerts an influence to the lower end (bottom surface) of the SOI layer. Therefore, the most important factor in the accumulation-mode device of this invention is to increase the work function difference.

FIG. 11(a) shows the thickness of an SOI layer that is allowed (normally-off is achieved) when use is made of a gate electrode with a work function of 5.2 eV or 6.0 eV in each accumulation-mode NMOS transistor. There are shown cases with gate insulating films of 0.5 nm and 1.0 nm by EOT, respectively. The thickness of the SOI layer allowed for achieving normally-off in each miniaturization generation (gate length) increases as the work function becomes larger and, in the 22 nm generation, the thickness in the case of 6.0 eV becomes about twice that in the case of 5.2 eV.

FIG. 11(b) shows band diagrams when the 5.2 eV and 6.0 eV gate electrodes are used (insulating film thickness 1 nm). As shown in the diagrams, as the work function increases, the SOI layer can be thicker and the current driving capability increases.

FIG. 3 shows the correlation diagram of the depletion layer thickness and the substrate impurity concentration. Referring to this figure, in the accumulation-mode NMOS transistor 100n, 102n of this invention, when the gate electrode 16 is formed of P+-polycrystal silicon, since its work function is approximately 5.15 eV and a work function of the $10^{17}$ cm$^{-3}$ n-type silicon layer 14n of the substrate is approximately 4.25 eV, a work function difference of approximately 0.9 eV occurs. In this event, since the thickness of a depletion layer is about 90 nm, the SOI layer is fully depleted even if it has a thickness of 45 nm. FIG. 3 shows the relationship between the substrate impurity concentration and the depletion layer thickness when the work function difference is 0.9V. Herein, the substrate impurity concentration and the SOI film thickness can be selected in a range where the SOI film thickness is smaller than the depletion layer thickness. As a gate electrode material, use may be made, instead of the polycrystal silicon, of W, Pt, Ni, Ge, Ru, or its silicide if the SOI layer is fully depleted in consideration of a work function difference.

The foregoing description has been made on the assumption that the channel region is formed on a plane within ±10° from the (110) plane. However, even in a transistor with a channel region formed on a plane other than a plane within ±10° from the (110) plane, for example, on the (100) plane, the same effect is obtained.

INDUSTRIAL APPLICABILITY

While this invention has been concretely described based on the several embodiments, it is needless to say that this invention is not limited thereto, but can be variously changed within a range not departing from the gist of the invention. For example, this invention can be not only used as a logic circuit element, but also similarly applied to various other electronic circuits.

The invention claimed is:

1. A semiconductor device comprising a circuit having transistors of different conductivity types, said semiconductor device comprising at least one kind of such transistor that comprises:
an SOI layer provided on an SOI substrate and a gate electrode formed by a high-concentration layer of the opposite conductivity type as said SOI layer and provided on said SOI layer,
wherein a thickness of said SOI layer is set so that a thickness of a depletion layer caused by a work function difference between said gate electrode and said SOI layer becomes greater than that of said SOI layer, and a surface of a region for forming a channel has a plane within ±10° from a (110) plane, and wherein areas, in a plane, of said transistors of different conductivity types and current driving capabilities thereof are substantially equal to each other.

2. A semiconductor device comprising a circuit having transistors of different conductivity types, said semiconductor device comprising:
a first MOS-type transistor provided on an SOI substrate, and
a second MOS transistor having, on a first face of said SOI substrate, a gate electrode of the same conductivity type as said first MOS-type transistor and source/drain layers of a conductivity type different from said first MOS-type transistor, wherein a surface of a region for forming a channel has a plane within ±10° from a (110) plane,
wherein an SOI layer is provided on said SOI substrate and has a controlled thickness so as to make areas, in a plane, of said transistors of different conductivity types and current driving capabilities thereof substantially equal to each other.

3. A semiconductor device according to claim 1, wherein a gate insulating film is formed between said gate electrode and said SOI layer and contains at least one of $SiO_2$, $Si_3N_4$, an oxide film of a metal silicon alloy, or a nitride film of a metal silicon alloy formed by a microwave-excited plasma.

4. A semiconductor device according to claim 3, wherein said gate insulating film is formed at a temperature of 600° C. or less.

5. A semiconductor device comprising a circuit having at least one pair of transistors of different conductivity types, wherein:
at least one of said transistors comprises at least a semiconductor layer provided on an SOI substrate, a gate insulating layer covering at least a portion of a surface of said semiconductor layer, and a gate electrode formed on said gate insulating layer and is configured to operate in a normally-off accumulation mode, and
a material of said gate electrode and an impurity concentration in said semiconductor layer are selected so that a thickness of a depletion layer formed in said semiconductor layer by a work function difference between said gate electrode and said semiconductor layer becomes greater than that of said semiconductor layer, and
wherein said normally-off accumulation-mode transistor has a channel region formed on a plane different from a plane within ±10° from a (110) plane.

6. A semiconductor device comprising a circuit having transistors of different conductivity types, said semiconductor device comprising at least one kind of such transistor that comprises:
an SOI layer provided on an SOI substrate and a gate electrode provided on said SOI layer,
wherein a thickness of said SOI layer and a material of said gate electrode are selected so that a thickness of a depletion layer caused by a work function difference between said gate electrode and said SOI layer becomes greater than that of said SOI layer, and a surface of a region for forming a channel has a plane within ±10° from a (110) plane, and
wherein areas, in a plane, of said transistors of different conductivity types and current driving capabilities thereof are substantially equal to each other.

7. A semiconductor device comprising a circuit having an NMOS transistor and a PMOS transistor, said semiconductor device comprising:
a substrate, at least a surface thereof being insulating;
a common semiconductor layer provided on an insulating surface of said substrate,
a pair of n-type high impurity concentration regions provided in a first portion of said common semiconductor layer, a region of said first portion of said common semiconductor layer between said n-type high impurity concentration regions being of n-type and used as a first channel region;
a first gate insulator film provided on said first channel region;
a first gate electrode provided on said first insulator film;
a pair of p-type high impurity concentration regions provided in a second portion of said common semiconductor layer, a region of said second portion of said common semiconductor layer between said p-type high impurity concentration regions being of n-type and used as a second channel region;
a second gate insulator film provided on said second channel region; and
a second gate electrode provided on said second insulator film;
wherein said NMOS transistor is a normally-off accumulation-mode NMOS transistor comprising said pair of n-type high impurity concentration regions, said first channel region, said first gate insulator film and said first gate electrode, and said PMOS transistor is an inversion-mode PMOS transistor comprising said pair of p-type high impurity concentration regions, said second channel region, said second gate insulator film and said second gate electrode; and
wherein the surfaces of said first channel region and said second channel region has a plane within ±10° from a (110) plane, and
areas of said surfaces of said first channel region and said second channel region and current driving capabilities of said PMOS and NMOS transistors are substantially equal to each other.

8. A semiconductor device according to claim 7, wherein each of said surfaces of said first channel region and said second channel region has a (551) plane.

9. A semiconductor device comprising a circuit having transistors of different conductivity types, said semiconductor device comprising:
a substrate, at least a surface thereof being insulating;
a first semiconductor layer provided on said insulating surface of said substrate; a top surface of said first semiconductor layer having a plane within ±10° from a (110) plane and said top surface and side surfaces of said first semiconductor layer being used as surfaces of a first channel region,
a second semiconductor layer provided, separately from said first semiconductor layer, on said insulating surface of said substrate, a top surface of said second semiconductor layer having a plane within ±10° from a (110) plane and said top surface of said second semiconductor layer being used as surfaces of a second channel region, a first gate insulator film provided on said first channel region;

a first gate electrode provided on said first insulator film;

a second gate insulator film provided on said second channel region; and a second gate electrode provided on said second insulator film;

wherein one of said transistors is a three-dimensional structure transistor of one conductivity type comprising said first channel region, said first gate insulator film and said first gate electrode, and another one of said transistors is a planar structure transistor of an opposite conductivity type comprising said second channel region, said second gate insulator film and said second gate electrode;

wherein areas of said first and second channel regions and current driving capabilities of said three-dimensional structure transistor and said planar structure transistor are substantially equal to each other.

10. A semiconductor device according to claim 9, wherein both of said three-dimensional structure transistor and said planar structure transistor are accumulation mode transistors.

11. A semiconductor device according to claim 9, wherein said three-dimensional structure transistor is an accumulation mode normally-off NMOS transistor and said planar structure transistor is an accumulation mode normally-off transistor.

12. A semiconductor device according to claim 10, wherein a thickness of said first semiconductor layer is set so that a thickness of a depletion layer caused by a work function difference between said first gate electrode and said first semiconductor layer becomes greater than that of said first semiconductor layer, and wherein a thickness of said second semiconductor layer is set so that a thickness of a depletion layer caused by a work function difference between said second gate electrode and said second semiconductor layer becomes greater than that of said second semiconductor layer.

13. A semiconductor device according to claim 11, wherein a thickness of said first semiconductor layer is set so that a thickness of a depletion layer caused by a work function difference between said first gate electrode and said first semiconductor layer becomes greater than that of said first semiconductor layer, and wherein a thickness of said second semiconductor layer is set so that a thickness of a depletion layer caused by a work function difference between said second gate electrode and said second semiconductor layer becomes greater than that of said second semiconductor layer.

14. A semiconductor device according to claim 9, wherein said top surfaces of the first and second semiconductor layers have a (551) plane.

15. A semiconductor device according to claim 10, wherein said top surfaces of the first and second semiconductor layers have a (551) plane.

16. A semiconductor device according to claim 11, wherein said top surfaces of the first and second semiconductor layers have a (551) plane.

* * * * *